July 11, 1972 W. M. MOREAU ET AL 3,676,002

OPTICAL MASK WITH INTEGRAL SPACERS AND METHOD OF MAKING

Filed June 30, 1969 2 Sheets-Sheet 1

INVENTORS
WAYNE M. MOREAU
HANS R. ROTTMANN

BY Theodore E. Galanthay
AGENT

United States Patent Office 3,676,002
Patented July 11, 1972

3,676,002
OPTICAL MASK WITH INTEGRAL SPACERS AND METHOD OF MAKING

Wayne M. Moreau, Wappingers Falls, and Hans R. Rottmann, Poughkeepsie, N.Y., assignors to International Business Machines Corporation, Armonk, N.Y.

Filed June 30, 1969, Ser. No. 837,802
Int. Cl. G03b *27/28*
U.S. Cl. 355—133 9 Claims

ABSTRACT OF THE DISCLOSURE

This is an optical mask primarily for use in the manufacture of solid state semiconductor devices. The mask has integral spacer portions which intimately contact the surface of the device during the stage in the processing when the photoresist is exposed. These integral spacers not only protect the mask during contact with the device but also provide improved devices because of superior optical characteristics.

BACKGROUND OF THE INVENTION

Field of the invention

This invention relates to optical masks and more particularly to optical masks having integral spacers. These masks are primarily for use in the manufacture of solid state semiconductor devices and particularly during the optical printing process. Under present technology, active areas in solid state devices and circuits are generally formed by etching the patterns into an oxide layer on the surface of the semiconductor material. The areas where etching is not desired are protected by a light-sensitive polymer commonly called a "photoresist." This protective polymer layer is formed by covering the entire semiconductor with the photosensitive resist, exposing the desired pattern into the resist, and then washing away those areas where etching is desired. This invention has application in the exposing step, i.e., when the desired pattern is printed into the resist. The printing process is usually performed by the use of an optical mask having various opaque and transparent areas formed therein, light being passed through said mask onto the device surface.

The projection of the mask pattern onto the semiconductor surface is performed in one of two well known ways. These include: projection by means of lenses and projection without lenses on contact printing. This invention is specifically related to an improvement in the latter technique. Studies of the contact exposure process have shown that, in general, no intimate contact exists between the two related surfaces. Good optical contact with the residual gap smaller than approximately 10 micro inches exists only in a few randomly situated spots or sections. This occurs because neither the mask surface nor the device surface are completely flat, meaning that they exhibit a certain surface waviness and, in addition, carry a number of imperfections, such as spikes, mounds, and, last but not least, dust particles. As is well known, the masks as well as the devices become damaged after a relatively small number of contact printing exposures have been performed. Since the manufacture of masks is relatively expensive, the cost of solid state devices increases as the number of devices that can be made with a single mask decreases.

It has been found that in contact printing a small spacing between the surface of the mask and the surface of the device (which is coated with photoresist) can be tolerated. Evidently, the abrasion of the mask is then reduced. This invention is an improvement in that field of contact printing which is frequently denoted as proximity printing, near-contact printing, or off-contact printing.

DESCRIPTION OF THE PRIOR ART

A promising attempt to solve the aforementioned problem of excessive mask wear was to coat the mask with a protective coating. Such prior art is exemplified by application Ser. No. 699,268 by Paul P. Castrucci et al., and assigned to the assignee of this invention. Another solution to the problem of excessive mask wear is taught in an article by P. M. Schaible, in the IBM (trademark) Technical Disclosure Bulletin, volume 8, No. 11, p. 1575. An additional solution to the same problem is found in an article by J. Sybalsky et al. in the IBM (trademark) Technical Disclosure Bulletin, volume 11, No. 5, p. 567. All these techniques have in common the concept of protecting a mask during the fabrication of solid state circuits and devices. The opaque portion of the mask is not permitted to touch the surface of the device, and is therefore left unharmed. When the opaque image portion of the mask does not come sufficiently close to the surface of the device, the geometrical or dimensional definition of the printed image deteriorates. As microminiaturized devices become even more compact, the definition of images printed by masks becomes increasingly critical. Prior techniques have failed to address and solve the problems of resolution and pattern definition (e.g. lines, dots, and holes) in proximity printing.

SUMMARY OF THE INVENTION

Accordingly, it is an object of this invention to provide a high degree of resolution in proximity printing by use of an improved optical mask.

More specifically, it is an object of this invention to provide an improved optical mask having integral spacers for use in proximity printing of images onto the surfaces of solid state devices and circuits.

A further object of this invention is to provide a protected optical mask having spacers which act as light pipes for conducting the light to the surface of the object being exposed.

A specific object of this invention is to construct the spacers from a material having an index of refraction similar to that of the photoresist on the surface of the semiconductor device.

Lastly, an object of this invention is to facilitate the escape of residual air from the space between the mask surface and the device surface, during the evacuation or reduction of air pressure.

In accordance with the invention, an optical mask having transparent and opaque portions is coated with a photosensitive material also referred to as photoresist. Photoresists include natural colloids such as albumen, gelatin, fish glue—which are generally sensitized by chromate salts such as potassium bichromate, as well as synthetic resins such as polyvinyl cinnamate, polymethyl methacrylate. A description of such synthetic resins and the line sensitizers conventionally used in combination with them may also be found in the text—"Light Sensitive Systems" by Jaromir Kosar, particularly at Chapter 4. Some photoresist compositions of this type are described in U.S. Pats. 2,610,120, 3,143,423, and 3,169,868. (A commercially available photoresist is Kodak Photo Resist-Type 2, trademark of the Kodak Company.)

The photosensitive material is exposed by passing light through the back-side of the glass substrate thereby using the opaque pattern as a mask. The photosensitive material is then developed and all unexposed portions are washed away. In this way, integral transparent spacers (adherently joined to the glass substrate) are provided for the mask so that during subsequent printing operations damage to the mask is prevented and superior optical characteristics are provided.

The foregoing and other objects, features and advantages of the invention will be apparent from the following more particular description of preferred embodiments of the invention as illustrated in the accompanying drawings.

DESCRIPTION OF THE PREFERRED EMBODIMENTS

Figure 1:
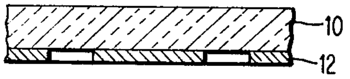
FIGS. 1, 2 and 3 show the optical mask in various stages of fabrication.

Refer now to FIG. 1 which shows an optical mask with a transparent base 10 and an opaque pattern 12. The mask as shown in FIG. 1 is well known and can be made by any number of available techniques. For example, the entire transparent surface 10, made of a material such as glass, can be coated with an opaque layer made from a material such as chromium or silver. Portions of the opaque surface 12 are then removed also by well known techniques.

Figure 2:
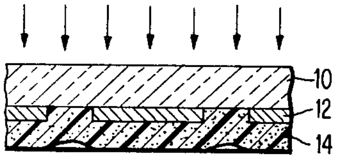

In accordance with the preferred embodiment of this invention, the structure of FIG. 1 is then coated with a layer of photosensitive material 14 to obtain the structure of FIG. 2. Layer 14 is spin coated to a uniform thickness in the order of 5000 A. to 10,000 A. The photoresist is processed according to the procedure recommended by the manufacturer. For example see: Data Book P–7, Kodak Photo-Sensitive Resists for Industry, Eastman Kodak Co., Rochester, N.Y., 1962. The photoresist coating is applied to the mask by high-speed whirling. The thickness can be varied by dilution of the photoresist or by the adjustment of the spin-speed. The film is prebaked at 120° C. for five minutes to remove the casting solvents. The mask is then placed with the opaque portion downward on a support and the photosensitive material is exposed by shining light down through the transparent base 10. The pattern in opaque layer 12 determines the portion of the photosensitive material 14 which is exposed to the light. The photosensitive material is then developed according to the manufacturer's instructions. A solvent such as xylene or toluene can be used for a three minute immersion. The photoresist is then post-baked at 150° C. for thirty minutes. By using negative photoresist, all the unexposed portions are washed away leaving the structure illustrated in FIG. 3.

Figure 3:
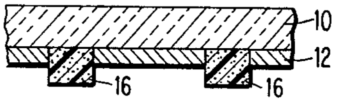

In this preferred embodiment, negative photosensitive material is used so that transparent spacers 16 are joined to those portions of base 10 which are not covered by opaque layer 12. The advantages of fabricating a mask structure as shown in FIG. 3 are described in detail hereinbelow. Those skilled in the art, however, will recognize that spacers integral with the mask can be provided by numerous techniques. As an example, the use of positive photoresist results in spacers covering the opaque portions of the mask. Furthermore, the spacers need not be made of photosensitive material at all, but could be any substance such as silicon dioxide ($SiO_2$), placed on the surface of the mask in a random manner. The preferred embodiment, however, uses the negative photosensitive material as described.

Figure 4A:
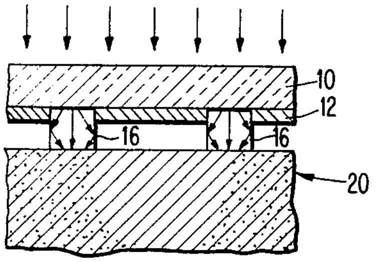
FIG. 4A shows an improved optical feature of this invention as compared to the prior art technique which is illustrated in FIG. 4B.
Figure 4B:
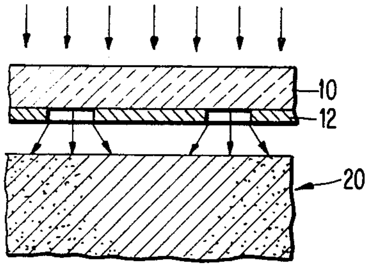

One advantage of the preferred embodiment is illustrated in FIGS. 4A and 4B. FIG. 4A shows the preferred embodiment used to expose the photosensitive material on the surface of solid state device 20. In microminiaturization, it is found that the surface of device 20 and of the mask are not flat but rather irregular with surface imperfections. Note that spacers 16 aid in bringing device 20 and the mask into uniform proximity. Note also, that spacers 16 act as light pipes in order to expose the surface of device 20 in the exact pattern as defined by layer 12. The result in resolution and line definition is therefore identical to that achieved by contact printing. FIG. 4B shows an alternate but less desirable embodiment of this invention where the integral spacers are placed elsewhere on the mask resulting in an air gap between the mask and device 20. Opaque layer 12 on the mask is still protected and proximity printing is achieved. However, in the absence of light pipes 16 the light scatters reducing resolution and edge definition. Furthermore, the lines actually printed on device 20 will tend to be wider than the gaps in the pattern in layer 12. Note that the embodiment of FIG. 4A is particularly advantageous when the photosensitive material on the surface of device 20 has an index of refraction similar to that of spacer 16.

Figure 5:
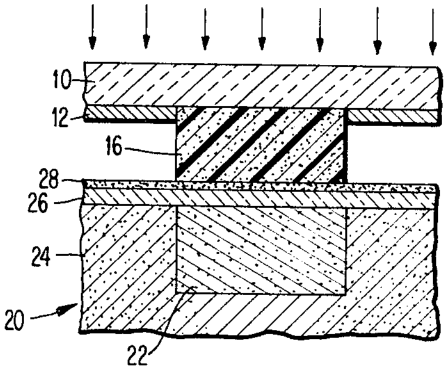
FIGS. 5, 6 and 7 show a solid state device in various stages of fabrication with the improved mask structure of this invention.
Figure 6:
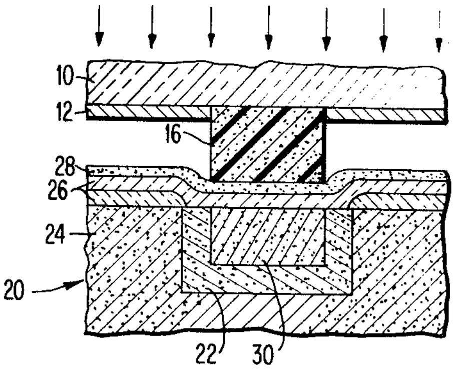
Figure 7:
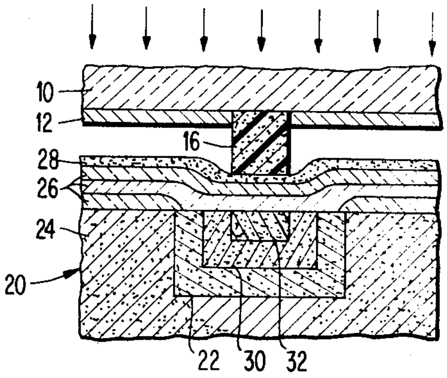

Refer now to FIGS. 5, 6 and 7 which show another advantage of the preferred embodiment of this invention. These figures show three different masks used in three succeeding exposing steps in the manufacture of device 20.

Refer first to FIG. 5 and assume that it is desired to diffuse a collector region 22 into a semiconductor crystal such as silicon 24. On the surface of silicon 24 is first grown a layer of silicon dioxide ($SiO_2$) 26 by any number of well known techniques. The $SiO_2$ layer 26 is then coated with a layer of photosensitive material 28. The mask is then brought in contact with the surface 28 of device 20. Of course, in accordance with our invention, only the spacers 16 come in contact. The photosensitive layer 28 is then exposed, developed, and a corresponding "window" is etched into layer 26. Collector region 22 is then diffused through this window. It is normal practice not to remove the $SiO_2$ layer 26 from any portion of the device other than the desired "window." Accordingly, there is a buildup of $SiO_2$ during subsequent processing.

Refer to FIG. 6 which shows the continued processing of device 20 when it is desired to diffuse a base region 30 into the collector region 22. In order to diffuse base region 30 into the device, it is first necessary to apply another layer 26 of $SiO_2$. A new layer 28 of photosensitive material is then applied. A mask having a pattern similar to the one used in FIG. 5 but with narrower lines, is superimposed over the device and photosensitive layer 28 is exposed. Note how spacer 16 fits into the "valley" which is inherently created by the residual layers of $SiO_2$. Photosensitive layer 28 is then developed and base region 30 is diffused into the device in the same way as collector region 22 was previously diffused.

Refer now to FIG. 7 for a further illustration of the advantages of the preferred embodiment. Three layers 26 of $SiO_2$ have been grown on the device and it is evident that each succeeding layer increases the depth of the depression or "valley" in the surface of the device. Again, a mask similar in pattern to those of FIG. 5 and FIG. 6 but with a narrower line is used to "pipe" the light onto photosensitive layer 28. In subsequent steps, layer 28 is developed, a "window" is etched in the $SiO_2$ layer, and emitter region 32 is diffused in a manner similar to the collector and base diffusion described hereinabove.

Figure 8:
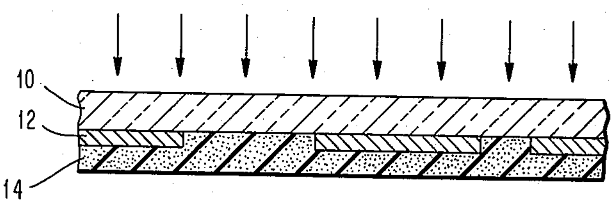
FIGS. 8 and 9 are an embodiment of the optical mask of this invention having variable line widths.
Figure 9:
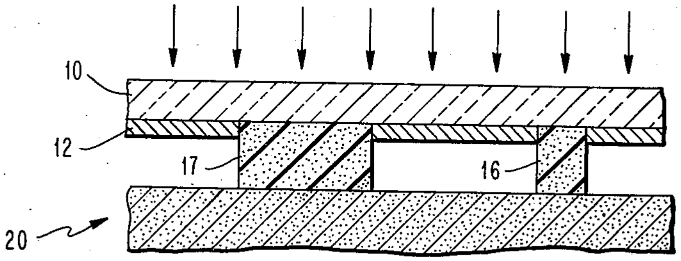

Refer now to FIGS. 8 and 9 for still another embodiment of this invention utilizing photosensitive material for spacers. The basic method of making this mask is similar to that described above. There is a difference, however, in that the line widths in the pattern in layer 12 are different. It has also been found that the photosensitive material 14 has a light transmissivity factor of approximately 70% at one micron thickness, with the sensitizer still in the material before development. Also, after development, the light transmissivity is approximately 90%. This transmission is with ultra-violet light in the actinic region of the photoresist (e.g. 3500–4500 A.).

The semi-transparency of the exposed photoresist is due to the presence of undissolved sensitizer. In particular, the width of the relief image also influences the rate of dissolution of the sensitizer. Lower transmissivity can be obtained in images of wider spacers. The removal of the solid sensitizer in the exposed portion occurs by a stepwise process of the permeation of the developer, the solvation of the sensitizer, and the transport of the solvated sensitizer into the bulk of the developer. Since the developer permeates the relief image through the top and two sides of the three-dimensional image, the surface area of the image will influence the rate of dissolution of the sensitizer. In a narrow image, the surface area of the two sides are closer to the dimensions of the top. The developer is able to penetrate the narrower image to a greater depth and dissolve more sensitizer. The loss of more sensitizer increases the transmission of the narrow lines. For the development of the photoresist at 25° C., shorter immersion times of less than the time required to completely remove the sensitizer in any size image (180 seconds for .80$\mu$ thick photoresists), can be empirically determined to produce variable transmissivity in various images. Therefore, by varying the time of development, it is possible to have the wider spacers 17 have a lower transmissivity to light than the narrow spacer 16. Accordingly, corresponding portions of the photoresist on the surface of device 20 are neither overexposed or underexposed during subsequent manufacturing steps. Typically, spacer 16 would be 2 microns or less in width and spacer 17 is any desired greater width. The spacer acts as a variable neutral density filter to the actinic wavelengths of photoresist exposure.

Figure 10:
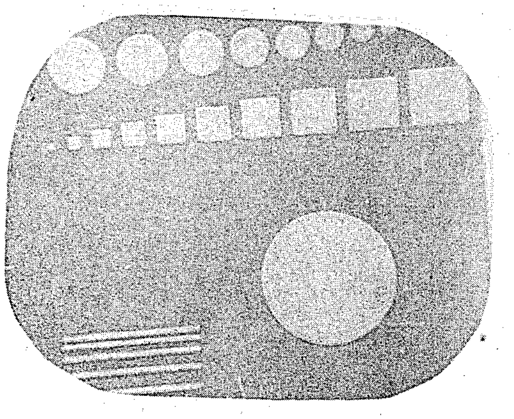
FIG. 10 is a photolithograph magnified 400× showing line resolution of patterns printed by contact printing with a prior art mask.
Figure 11:
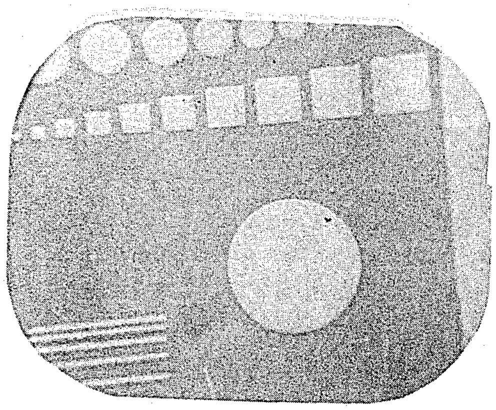
FIG. 11 shows a similar pattern made by proximity printing with a mask constructed in accordance with this invention.

Refer now to FIG. 10 which is a 400× enlargement of a pattern made by direct contact printing. The smallest pattern is 2.0 microns. In comparison, refer to FIG. 11 which is the identical pattern printed by proximity printing in accordance with a mask of this invention with 0.50 micron spacers of photosensitive material. Note that there is no apparent deterioration in resolution, line width or line definition. Therefore, the mask of this invention provides optical proximity printing of the same quality as contact printing but with a protected mask. Should the spacers ever become damaged, it is a simple matter to remove all the spacers without effecting the remainder of the mask. New spacers are then provided in accordance with the method shown in FIGS. 1, 2 and 3 thereby providing an identical new mask at minimal cost.

While the invention has been particularly shown and described with reference to preferred embodiments thereof, it will be understood by those skilled in the art that changes in form and detail may be made therein without departing from the spirit and scope of the invention.

What is claimed is:

1. An optical mask for use in making solid state devices and circuits comprising:
- a transparent substrate;
- an opaque pattern in adherent contact with one side of said transparent substrate; and
- at least one spacer consisting of photoresist material in adherent contact with the transparent substrate on the same side as said opaque pattern.

2. In an optical mask having transparent base regions and opaque regions, the improvement comprising:
- spacers integral with said mask and adjacent to said transparent base regions, said integral spacers consisting of a photoresist material.

3. In an optical mask having transparent base regions and opaque regions, the improvement comprising:
- a plurality of spacers integral with said mask and adjacent to said transparent base regions;
- a first one of said plurality of spacers having a first line width;
- at least a second one of said plurality of spacers having a second line width, said second line width being greater than said first line width;
- said at least second one of said plurality of spacers having said greater line width having a lower transmissivity to light than said first plurality of spacers.

4. In an optical mask having the transparent base regions and opaque regions, the improvement comprising:
- spacers integral with said mask and adjacent to said transparent base regions, said integral spacers having a coefficient of refraction similar to the coefficient of refraction of the surface of a solid state device to be made;
- whereby said integral spacers act as light pipes.

5. An optical mask in accordance with claim 4 wherein the integral spacers partially fit into grooves in the solid state device during the exposing process in the manufacture of the device.

6. The method of making an optical mask for use in the manufacture of solid state devices and circuits comprising the steps of
- coating a transparent substrate with an opaque material,
- removing portions of said opaque material in order to permit light to pass through desired portions of said transparent substrate,
- coating said opaque pattern and exposed portions of said transparent substrate with a photosensitive material,
- transmitting light through said transparent substrate such that portions of said photosensitive material are exposed,
- washing away unexposed portions of said photosensitive material,
- whereby said photosensitive material is retained as an integral spacer for the mask.

7. The method in accordance with claim 6 wherein the photosensitive material provides a variable transmissivity to light after development,
- whereby narrow lines have a high degree of transmissivity and wider lines have a lesser degree of transmissivity thereby causing a uniform exposure of subsequent solid state devices to be made with said mask.

8. The method in accordance with claim 6 wherein a positive photosensitive material is used thereby washing away exposed portions of said photosensitive material.

9. The method in accordance with claim 6 wherein a separate mask is used for exposing said photosensitive material whereby said integral spacers occur in a random pattern.

References Cited

UNITED STATES PATENTS

| | | | |
|---|---|---|---|
| 3,519,348 | 7/1970 | McLaughlin | 355—125 X |
| 3,507,592 | 4/1970 | McLaughlin | 355—125 X |
| 1,113,550 | 10/1914 | Goldberg | 95—85 |

JOHN M. HORAN, Primary Examiner